US009692337B2

United States Patent
Laursen

(10) Patent No.: US 9,692,337 B2
(45) Date of Patent: Jun. 27, 2017

(54) METHOD FOR CONTROLLING A SYNCHRONOUS RELUCTANCE ELECTRIC MOTOR

(71) Applicant: Danfoss Drives A/S, Graasten (DK)

(72) Inventor: Michael Laursen, Kolding (DK)

(73) Assignee: Danfoss Drives A/S, Graasten (DK)

( * ) Notice: Subject to any disclaimer, the term of this patent is extended or adjusted under 35 U.S.C. 154(b) by 10 days.

(21) Appl. No.: 14/407,493

(22) PCT Filed: Jun. 11, 2013

(86) PCT No.: PCT/DK2013/000038
§ 371 (c)(1),
(2) Date: Dec. 12, 2014

(87) PCT Pub. No.: WO2013/185762
PCT Pub. Date: Dec. 19, 2013

(65) Prior Publication Data
US 2015/0188472 A1    Jul. 2, 2015

(30) Foreign Application Priority Data
Jun. 15, 2012 (GB) .................................. 1210705.8

(51) Int. Cl.
*H02P 21/00* (2016.01)
*H02P 21/06* (2016.01)
(Continued)

(52) U.S. Cl.
CPC ...... *H02P 21/0035* (2013.01); *G01R 19/0092* (2013.01); *H02P 9/107* (2013.01);
(Continued)

(58) Field of Classification Search
CPC ...... H02P 25/06; H02P 6/006; H02P 21/0053; H02P 21/146; H02P 2203/11;
(Continued)

(56) References Cited

U.S. PATENT DOCUMENTS 6,188,196 B1    2/2001 Koide et al.
6,646,409 B2   11/2003 Won et al.
(Continued)

FOREIGN PATENT DOCUMENTS

| CN | 1437791 A | 8/2003 |
|----|-----------|--------|
| CN | 1489278 A | 4/2004 |

(Continued)

OTHER PUBLICATIONS

International Search Report for PCT Serial No. PCT/DK2013/000037 dated Apr. 15, 2014.
(Continued)

*Primary Examiner* — Paul Ip
(74) *Attorney, Agent, or Firm* — McCormick, Paulding & Huber LLP

(57) ABSTRACT

A method (29) for controlling a synchronous reluctance electric motor (2) is suggested, wherein the electric voltage (7) that is applied to the synchronous reluctance electric motor (2) is controlled, and wherein the control of said electric voltage (7) is based on the electric current (14) in the d-q-reference frame (25, 26).

8 Claims, 3 Drawing Sheets

(51) Int. Cl.
*H02P 9/10* (2006.01)
*G01R 19/00* (2006.01)
*H02P 21/22* (2016.01)
*H02P 25/092* (2016.01)

(52) U.S. Cl.
CPC .......... *H02P 21/0003* (2013.01); *H02P 21/06* (2013.01); *H02P 21/22* (2016.02); *H02P 25/092* (2016.02)

(58) Field of Classification Search
CPC .......... H02P 6/183; H02P 6/185; H02P 21/18; H02P 21/14; H02P 6/18; H02P 21/32; H02P 2203/09; H02P 2207/05; H02P 21/24; H02P 21/26; H02P 25/08; H02P 27/08; H02P 21/0025; H02P 21/06
USPC .............................. 318/400.02, 701, 801, 807
See application file for complete search history.

(56) References Cited

U.S. PATENT DOCUMENTS

| | | | |
|---|---|---|---|
| 6,650,083 B2 | 11/2003 | Jung | |
| 7,005,828 B2 | 2/2006 | Karikomi | |
| 7,071,651 B2* | 7/2006 | Toyozawa | H02P 6/183 318/801 |
| 7,170,283 B2 | 1/2007 | Toyozawa et al. | |
| 7,276,877 B2 | 10/2007 | Qiu et al. | |
| 7,504,797 B2* | 3/2009 | Tomigashi | H02P 21/18 318/727 |
| 7,772,790 B2* | 8/2010 | Nashiki | H02K 1/145 318/400.02 |
| 7,816,822 B2* | 10/2010 | Nashiki | H02K 1/145 310/185 |
| 7,898,197 B2* | 3/2011 | Tomigashi | H02P 21/10 318/400.02 |
| 7,919,900 B2 | 4/2011 | Kusase | |
| 7,932,692 B2* | 4/2011 | Inokuma | H02P 21/14 318/432 |
| 7,969,103 B2* | 6/2011 | Sepe, Jr. | H02P 25/06 318/135 |
| 7,986,117 B2* | 7/2011 | Yamamoto | B60L 15/025 318/400.02 |
| 8,018,185 B2* | 9/2011 | Yamamoto | B60L 15/025 318/400.02 |
| 8,067,874 B2 | 11/2011 | Kusase | |
| 8,159,161 B2* | 4/2012 | Tomigashi | H02P 6/183 318/400.01 |
| 8,174,220 B2 | 5/2012 | Inoue et al. | |
| 2001/0002784 A1* | 6/2001 | Masaki | H02P 6/18 318/727 |
| 2001/0024100 A1* | 9/2001 | Shinnaka | H02P 21/12 318/701 |
| 2001/0028236 A1* | 10/2001 | Cheong | H02P 25/08 318/701 |
| 2002/0043953 A1* | 4/2002 | Masaki | B60L 11/14 318/700 |
| 2003/0062869 A1 | 4/2003 | Ieoka | |
| 2003/0128009 A1* | 7/2003 | Sakurai | H02P 6/18 318/722 |
| 2004/0100222 A1 | 5/2004 | Karikomi | |
| 2005/0007044 A1 | 1/2005 | Qiu et al. | |
| 2005/0104582 A1 | 5/2005 | Toyozawa et al. | |
| 2005/0110452 A1* | 5/2005 | Toyozawa | H02P 6/183 318/807 |
| 2005/0212471 A1 | 9/2005 | Patel et al. | |
| 2007/0046249 A1* | 3/2007 | Tomigashi | H02P 21/18 318/807 |
| 2008/0111516 A1* | 5/2008 | Inokuma | H02P 21/14 318/799 |
| 2008/0129243 A1* | 6/2008 | Nashiki | H02K 1/145 318/701 |
| 2008/0284360 A1* | 11/2008 | Sepe, Jr. | H02P 6/006 318/135 |
| 2009/0026988 A1* | 1/2009 | Tomigashi | H02P 21/10 318/400.02 |
| 2009/0026997 A1 | 1/2009 | Satake | |
| 2009/0218907 A1 | 9/2009 | Kusase | |
| 2009/0236930 A1* | 9/2009 | Nashiki | H02K 1/145 310/257 |
| 2009/0237014 A1 | 9/2009 | Yamada | |
| 2009/0237021 A1* | 9/2009 | Yamamoto | B60L 15/025 318/400.15 |
| 2009/0237022 A1* | 9/2009 | Yamamoto | B60L 15/025 318/400.26 |
| 2009/0322264 A1* | 12/2009 | Imura | B60L 15/025 318/400.09 |
| 2010/0045218 A1* | 2/2010 | Tomigashi | H02P 6/183 318/400.02 |
| 2010/0156330 A1 | 6/2010 | Inoue et al. | |
| 2011/0031909 A1 | 2/2011 | Ohgushi | |
| 2011/0084634 A1 | 4/2011 | Kusase | |
| 2011/0248659 A1* | 10/2011 | Balazovic | H02P 6/183 318/400.33 |
| 2011/0298403 A1* | 12/2011 | Yamamoto | B60L 15/025 318/400.02 |
| 2011/0304286 A1* | 12/2011 | Sepe, Jr. | H02P 25/06 318/135 |
| 2011/0307232 A1* | 12/2011 | Sepe, Jr. | H02P 25/06 703/13 |
| 2012/0119686 A1 | 5/2012 | Bertotto et al. | |
| 2012/0123715 A1* | 5/2012 | Eskola | G01R 31/34 702/65 |
| 2012/0206077 A1* | 8/2012 | Yoneshima | H02P 6/185 318/400.33 |
| 2012/0217849 A1* | 8/2012 | Aoki | H02P 6/18 310/68 D |
| 2013/0257324 A1 | 10/2013 | Maekawa | |
| 2014/0285125 A1 | 9/2014 | Kato | |
| 2014/0292239 A1 | 10/2014 | Kato | |
| 2014/0346983 A1 | 11/2014 | Kato | |
| 2015/0115850 A1 | 4/2015 | Laursen | |

FOREIGN PATENT DOCUMENTS

| | | |
|---|---|---|
| CN | 1976211 A | 6/2007 |
| CN | 101383582 A | 3/2009 |
| JP | 2004-064860 A | 2/2004 |
| JP | 2006-025583 A | 1/2006 |
| KR | 2000-0046678 A | 7/2000 |

OTHER PUBLICATIONS

K.A. Mary et al: "A generalized approach to the design of the speed control system for inverter-driven permanent magnet synchronous motor" IET-UK International Conference on Information and Communication Technology in Electrical Sciences (ICTES 2007), Dec. 20-Dec. 22, 2007, pp. 441-447.

Ming-Tsan Lin et al.: "Design and implementation of a direct torque controlled interior permanent magnet synchronous motor drive based on a novel flux model", Power Electronics and Drive Systems (PEDS), 2011 IEEE Ninth International Conference on, IEEE, Dec. 5-Dec. 8, 2011, pp. 394-398.

Yangzhong Zhou et al.: "Research on a direct torque control for an electrically excited synchronous motor drive with low ripple in flux and torque", Frontiers of Electrical and Electronic Engineering in China, vol. 2, No. 4, Oct. 1, 2007, pp. 425-431.

Great Britain Search Report for Serial No. GB1210706.6 dated Oct. 29, 2012.

British Search Report for Application No. GB1210705.8 dated Nov. 5, 2012.

International Search Report for PCT Serial No. PCT/DK2013/000038 dated Apr. 22, 2014.

Ghaderi A. et al. "A Novel Implementation of Low Speed Sensorless Vector Control of Synchronous Reluctance Motors with a New Online Parameter Identification Approach", Applied Power Electronics Conference and Exposition, 2006. APEC '06, Twenty-First Annual IEEE Mar. 19, 2006, Piscataway, NJ, USA, IEEE, Piscataway, NJ, USA Mar. 19, 2006, pp. 211-217.

(56) References Cited

OTHER PUBLICATIONS

K. Alice Mary et al. "A Generalized Approach to the Design of the Speed Control System for Inverter-Driven Permanent Magnet Sychronous Motor" IET-UK International Conference on Information and Communication Technology in Electrical Sciences. Tamil Nadu, India. Dec. 20-22, 2007. p. 441-447.

* cited by examiner

METHOD FOR CONTROLLING A SYNCHRONOUS RELUCTANCE ELECTRIC MOTOR

CROSS-REFERENCE TO RELATED APPLICATION

This application is entitled to the benefit of and incorporates by reference subject matter disclosed in International Patent Application No. PCT/DK2013/000038 filed on Jun. 11, 2013 and Great Britain Patent Application 1210705.8 filed Jun. 15, 2012.

FIELD OF THE INVENTION

The invention relates to a method for controlling a synchronous reluctance electric motor or permanent magnet assisted synchronous reluctance electric motor, wherein at least one electric voltage that is applied to the synchronous reluctance electric motor is controlled. Additionally, the invention relates to a controller unit for controlling a permanent magnet assisted synchronous reluctance electric motor or a synchronous reluctance electric motor. Furthermore, the invention relates to an electric motor unit.

BACKGROUND

Electric motors are nowadays employed for a plethora of different applications in essentially all fields of technology. Depending on the actual use of the respective electric motor, various types and various sizes of electric motors are employed.

As an example, if an electric motor has to be used for an application where a constant turning speed of the electric motor can be used or is even required, a synchronous electric motor without a commutator can be used, in particular if alternating current is available. However, a start-up of such an electric motor might be difficult if a load with a large moment of inertia has to be driven.

If, however, a variable turning speed of the electric motor has to be provided (and additionally in the case of a direct current source), the traditional approach was to use electric motors, comprising a commutator (so called asynchronous electric motors). A problem involved with such commutated electric machines is the commutator, since this is a component that is particularly subject to a non-negligible wear. Furthermore, when using a commutator, typically sparks occur when the electric motor is turning. Such sparks can render the resulting electric motor unusable for certain applications, in particular if flammable gases are around, unless additional precautions are taken.

With the advent of modern semiconductor-based power electronics, the use of synchronous electric motors, in particular synchronous reluctance electric motors, has become more and more widespread. With such synchronous electric motors, commutators can be dispensed with. Furthermore, by providing an alternating electric current with a variable frequency, a synchronous electric motor can be driven at essentially any rotating speed. Even changes in turning speed can be realised. This has made possible certain applications that were hard to achieve, if at all, beforehand.

With the increasing number of electric motors there is an increasing interest for simple methods for controlling electric motors. This is because this way the necessary electronics for controlling the electric motors can become simpler and hence smaller, less energy consuming, more reliable and in particular less costly.

Although a number of different controllers for electric motors and a variety of methods for driving electric motors are known in the state of the art, there is still a desire for further improvements.

SUMMARY

It is therefore the object of the invention to provide a method for controlling a synchronous reluctance electric motor that is improved over presently known methods for controlling a synchronous reluctance electric motor. It is another object of the invention to provide a controller unit for controlling a synchronous reluctance electric motor that is improved over presently known controller units for controlling a synchronous reluctance electric motor. Yet another object of the invention is to provide an electric motor unit that is improved over electric controller units according to the state of the art.

The presently proposed invention seeks to address these objects.

It is suggested to perform a method for controlling a synchronous reluctance electric motor or a permanent magnet assisted synchronous reluctance electric motor, wherein at least one electric voltage applied to the synchronous reluctance electric motor is controlled in a way that the control of said electric voltage is at least in part and/or at least at times based on at least one electric current in the d-q-reference frame. The d-q-reference frame is usually the reference frame of the rotating rotor that is connected to the shaft of the electric motor. Therefore it can be considered to be some kind of a "rotating mechanical reference frame". It is usually not identical to the rotating magnetic field system of the stator (which is typically referred to as the so-called stator reference frame and/or the x-y-reference frame), in particular if a load is imposed on the electric motor. Typically, if the load to the electric motor is increased, the angle between the d-q-reference frame and the x-y-reference frame will increase. Typically, once an angle of 90° between the d-q-reference frame and the x-y-reference frame is exceeded, a normal mechanical rotation of the electric motor cannot be sustained. The electric voltage is preferably controlled vectorially, i.e. both its magnitude and its direction are controlled (vector parameter). Preferably, the control is performed essentially during the majority of the time (or essentially all the time) based on said at least one electric current. However, it can be preferred if an exception to this general rule is foreseen in the case of "unusual" situations like an emergency shut-down operation, during missing control input or the like. First experiments have shown that using the suggested method, a very efficient control of a synchronous reluctance electric motor can be realised with a very simple algorithm. In particular, it is even possible to essentially perform the control of the synchronous reluctance electric motor by measuring and calculating a single value, comparing it to a single reference value and to generate an appropriate output signal. By a "value", a vectorial value and/or a single parameter is encompassed. A vector can comprise several dimensions, in particular two, three, four, five, six or more dimensions. Consequently, any means for implementing the suggested method can be accordingly simple.

Preferably, the method is employed in a way that said at least one electric current is the electric current in the d-direction. The d-axis of the d-q-reference frame is typically defined as the fraction of the applied electric current that is the cause for creating the magnetic field (magnetising current), while the q-direction of the d-q-reference frame is the part of the electric current that is producing the generated torque (torque producing current). First experiments have shown that an electric current in the d-direction is particularly useful for implementing a method for controlling a synchronous reluctance electric motor.

According to a preferred embodiment of the invention, the method is performed in a way that said at least one electric current is compared to at least one reference value. This comparison can be both performed with respect to a single parameter (like the magnitude of an electric current or the angle of an electric current), with respect to a combination of two or more parameters and/or with respect to one or more vectors (like a vectorial electric current, as an example; wherein the dimension of the vector can be two, three, four, five, six or higher and/or a plurality of vectors can be used). First experiments have shown that such a comparison can be performed comparatively easy and that the result of such a comparison is usually very suitable for controlling a synchronous reluctance electric motor, at least as a "starting point" for further calculations. The reference value can be fixed or can be varied depending on working conditions and/or external parameters (including user commands). As examples for working conditions, a temperature, a required torque, mechanical limitations of the electric motor and/or components that are connected to the electric motor, power consumption limitations, turning speed of the electric motor or the like can be used.

It is furthermore possible that the method is performed in a way that essentially a single electric current is used for determining said electric voltage. Using such a preferred embodiment, the control algorithm can usually be particularly simple. Therefore, the means for implementing such a method can typically be correspondingly simple. Nevertheless, as first experiments have indicated, the control of the synchronous reluctance electric motor can be performed in a very suitable way.

Even more preferred, it is suggested to perform the method in a way that said at least one electric current is calculated from the measured electric currents through the synchronous reluctance electric motor that is controlled by the method. Using this preferred embodiment, usually a very good control can be performed with relatively little effort. In particular, usually the electric current through the electric motor has to be determined anyhow for performing a variety (if not all) control strategies. Therefore, the respective sensors are typically already present. Nevertheless, it should be mentioned that it is also possible that at least a part of the electric currents are determined from the actuation pattern (for example from a pulse width ratio, the electric voltage, changes in the electric parameters or the like). Usually, one, two or a relatively small number of electric currents are sufficient to perform a comparatively good control of the electric motor. As an example, if a three-phase electric motor is actuated as suggested, the electric current of a single phase, of two phases, of three phases and presumably additionally a star point electric current can be measured.

In particular it is possible that the method is performed in a way that the measured electric current(s) are first transformed into a rotating reference frame (preferably the x-y-system). This way, the control strategy (in particular a comparison between a current parameter/set of parameters and a reference parameter/set of reference parameters) can be performed particularly easily. It is to be noted that the measured electric current(s) is/are measured in a static reference frame. Typically, these electric current(s) is/are varying sinusoidally with time. The rotating reference system should preferably rotate with the same rotating speed as the rotor of the electric motor, at least as long as the working conditions (in particular the mechanical load imposed onto the electric motor) are not changed. Therefore, it is still possible that a "creeping change" between said rotating reference frame and the rotor of the electric motor can occur, in particular if working conditions change. This recalculation cannot be only done once, but even several times (as an example two times). In particular, additionally and/or alternatively, a re-calculation from one rotating reference frame into another rotating reference frame can be done. According to preferred embodiment, the external electric currents (varying periodically according to the turning speed of the electric motor) can be first transformed into the x-y-reference frame and afterwards into the d-q-reference frame.

Furthermore, the method can be performed in a way that the control of said at least one electric voltage is at least at times additionally based on at least one sensor signal and/or at least at times based on at least one control command. This way, the control of the electric motor can be even better adapted to user preferences and/or a required behaviour of the electric motor and/or to current working conditions of the electric motor. In particular, a sensor can be used for determining the temperature of the electric motor, its turning speed or the like.

Additionally, it is suggested to perform the method in a way that at least at times at least one damping loop is used. The damping loop uses a high-pass filter in order to modulate the supply frequency to the machine. This is provided to stabilize the machine since it is not generally possible to ramp-up a synchronous reluctance machine without this damping loop.

It is furthermore suggested to perform the method in a way that at least in part and/or at least at times at least one limiting function is applied, preferably at least one limiting function that limits at least one electric voltage and/or at least one electric current that is applied to the electric motor and/or at least one mechanical force that is generated. This way, it is possible that overload conditions are avoided and hence the reliability of the system can usually be improved. The limiting function can be even employed in a "two-step approach", meaning that, as an example, a certain limit may be exceeded under certain conditions and/or for a certain period of time, while a second limiting value comprises an "absolute value" that must never be exceeded. Using such a two-step approach, it is possible to optimise the resulting system even further. In particular, an unnecessarily large electric motor for working conditions that occur only very rarely can be avoided.

Another preferred embodiment of the method can be achieved if at least in part and/or at least at times at least one correcting function is applied that is correcting for non-linear behaviour of at least one electric and/or electronic component. This way, the overall control of the electric motor can be even more precise, resulting in an even more improved system. In particular, the correcting function can be modified according to the particular embodiment of the electric motor unit, the synchronous reluctance electric motor and/or the controller unit that is/are employed.

Furthermore, a controller unit is suggested that is designed and arranged in a way to perform a method according to the previous suggestions. Such a controller unit can be used for driving a synchronous reluctance electric motor. The resulting controller unit and/or the resulting synchronous reluctance electric motor, driven by the controller unit, can show the previously described features and advantages, at least in analogy. Also, variations and improvements according to the previous description can be employed for the controller unit as well, at least in analogy.

In particular, it is possible that the controller unit comprises at least one inverter unit. Such inverter units are typically used for changing a direct electric current into an alternating electric current (typically of a variable frequency). Also, such inverter units can be used for varying the frequency of an alternating electric current. In principle, the inverter unit can be of any design. For example, DIACs, TRIACs, thyristors, IGBTs, FETs, MOSFETs or the like can be used.

According to a preferred embodiment of the controller unit, at least one electric current measuring device, preferably an array of electric current measuring devices are used. This way, particularly precise values can be used as input parameters for the control of the electric motor. Typically, such electric current measuring devices are relatively inexpensive. The electric current measuring devices can be of essentially any design, in particular according to any design that is known in the state of the art.

Preferably, the controller unit comprises a programmable memory device. In the programmable memory device, a method according to the previous description can be stored.

Of course, the controller unit can be designed in a variety of ways. In particular, a partially analog and/or a partially digital design is possible. In particular, programmable computer devices (for example single-board computers) can be employed for this purpose.

Furthermore, an electric motor unit, in particular an electric motor unit comprising at least a synchronous reluctance electric motor unit is suggested that comprises at least one controller unit according to the previous description and/or that is designed and arranged in a way to perform a method according to the previous description. Such an electric motor unit can show the same features and advantages as previously described, at least in analogy. Furthermore, such an electric motor unit can be modified according to the previous description as well, at least in analogy.

BRIEF DESCRIPTION OF THE DRAWINGS

The present invention and its advantages will become more apparent, when looking at the following description of possible embodiments of the invention, which will be described with reference to the accompanying figures, which are showing.

DETAILED DESCRIPTION

Figure 1:
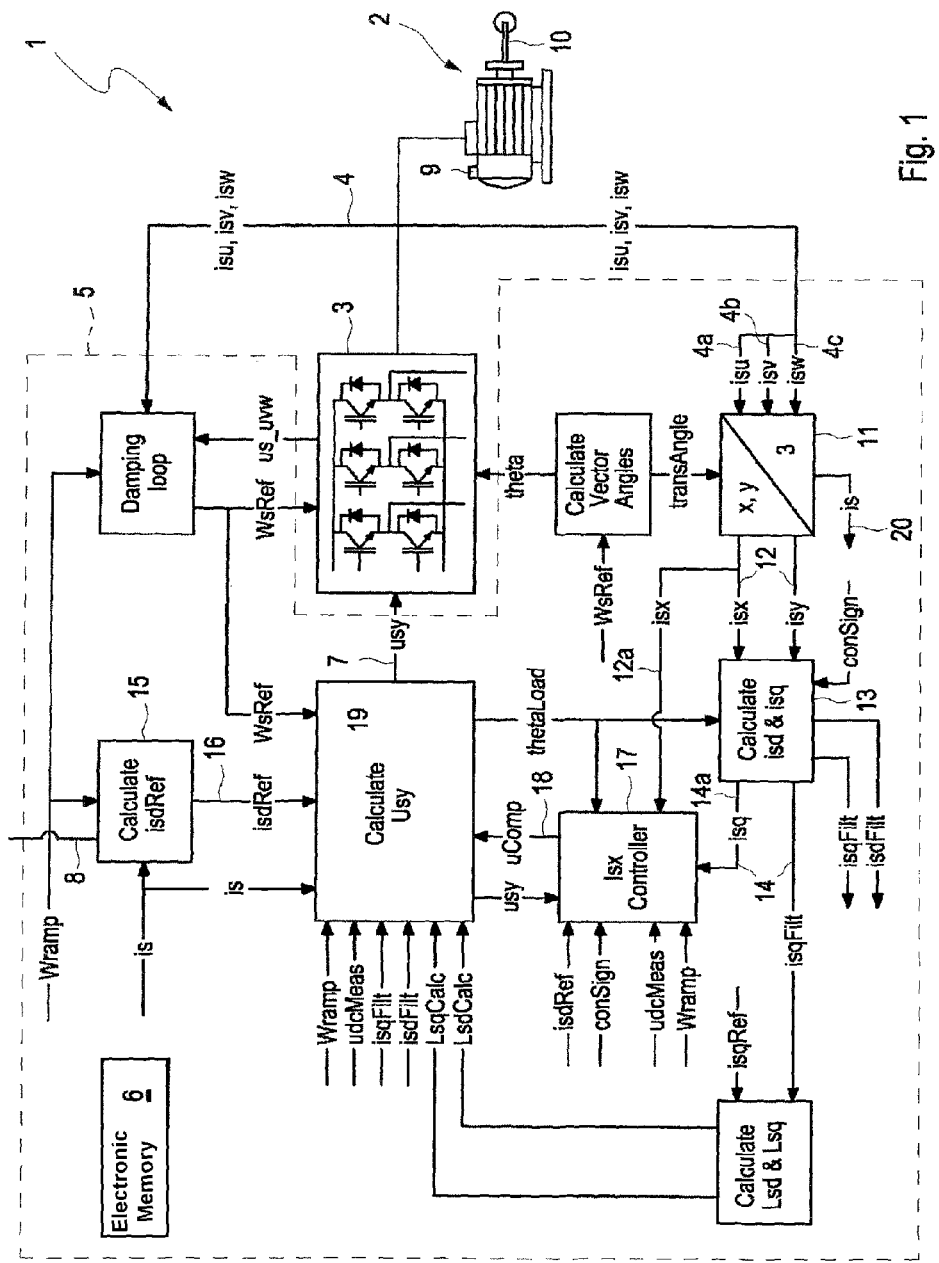
FIG. 1: is a block diagram of a possible embodiment of an electric motor unit.

In FIG. 1 a schematic block diagram of a possible embodiment of an electric motor unit 1 is shown. The electric motor unit 1 of the presently shown embodiment comprises an electric motor 2 of a synchronous reluctance motor design (synchronous reluctance machine or a permanent magnet assisted synchronous reluctance electric motor). The electric motor 2 is electrically driven by an inverter unit 3 that is used to provide the electric motor 2 with an electric current 4 of a variable frequency. In the presently shown embodiment, the electric current 4 that is used for driving the electric motor 2 (and hence the electric current 4 that is provided by the inverter unit 3) is of a three-phase type. In the presently shown embodiment, the inverter unit 3 generates the electric current 4 out of a direct electric current (direct current source not shown in FIG. 1).

The control of the inverter unit 3 is performed by an electronic controller unit 5 that is of a single-board computer type in the presently shown embodiment. Within the block, representing the electronic controller unit 5, another block is indicated that represents an electronic memory 6 in which a program for the actuation of the electric motor 2 via the inverter unit 3 is stored.

It is to be understood that the electric current 4 that is going through the electric motor 2 is not directly controlled by the electronic controller unit 5 and/or the electric inverter unit 3. Instead, a vectorial value for the driving voltage vector 7 is the value that is directly controlled. This value is the output value (voltage vector 7) of the electronic controller unit 5 and hence the input value of the inverter unit 3. The electric current 4 (in particular the presently three phases u, v, w of the electric current 4) contains some "response function" of the electric motor 2, already. Therefore, the electric current 4 can be measured and used as the (usually) main input value of the electronic controller unit 5. Additionally, a user input line 8 is indicated in FIG. 1. This user input line 8 can be used for requesting a certain turning speed or the like. Furthermore some sensors 9 can be foreseen (only schematically indicated in FIG. 1) for collecting additional data. As an example, a sensor 9 can probe for a temperature, the mechanical position of the rotor, the turning speed of the rotor 10 or the like. It is to be understood, however, that according to the presently proposed invention the sole use of the electric current 4 is sufficient for realising the required control of the electric motor 2 and so the sensors 9 are typically omitted. The electric motor unit 1 (in particular the electronic controller unit 5) can hence be simple, small and relatively inexpensive.

The measured electric current 4 (where the measurement can be done by current sensors that are presently not indicated) forms the "main" data input source for the electronic controller unit 5. The measured electric current 4 (that is measured in a stationary reference frame and hence varies with time; typically with a sinusoidal shape) is first transformed into the x-y-system (x-y-reference frame; see also FIG. 3). The x-y-system corresponds to the rotating magnetic field that is created by the stator of the electric motor 2. The x-y-system will rotate with the rotating frequency ω of the driving shaft 10/rotor of the electric motor 2. Because the x-y-system rotates together with the rotor of the electric motor 2, the output currents 12 $i_{sx}$ and $i_{sy}$ are relatively constant with time. In particular, they do not vary with the rotating frequency of the electric motor 2. However, changes that are due to a different rotating speed, a different load on the electric motor 2 or the like are of course still possible.

Figure 3:
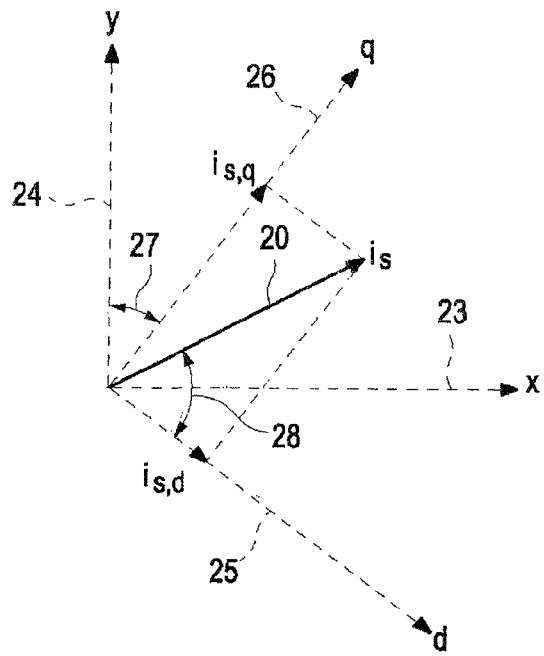
FIG. 3: is a vector diagram showing the relation between the different vectors in the different reference systems.

The calculated electric currents $i_{sx}$, $i_{sy}$ 12 in the x-y-system are passed on to the next logic block 13, where the electric currents are recalculated another time into the d-q-system (see also FIG. 3). The d-q-system (d-q-reference frame) rotates with the same frequency ω as the x-y-system and hence as the rotor of the electric motor. However, if a load is applied to the rotating shaft 10 of the electric motor 2, a shift between the x-y-system and the d-q-system will usually occur. This shift will manifest itself in form of the so-called load angle 27. This will be further elucidated with respect to FIG. 3. Now, we have the electric current 14 (including its various components) in the d-q-system.

In parallel, the measured overall stator current $i_s$ is used and compared with the various user inputs 8. From this, the commanded referencing stator current isdRef 16 is calculated in the isdRef calculation block 15. The stator current $i_s$ is a vector formed of a q-axis component ($i_q$) and a d-axis component ($i_d$). The angle of the vector relative to the d-axis is the torque angle 28 (see FIG. 3).

The value of the commanded reference current 16 is one of the three major input parameters for the stator current controller box 17. The other two crucial parameters are the fraction of the stator current parallel to the x-axis in the x-y-system $i_{sx}$ 12a and the fraction of the stator current parallel to the q-axis in the d-q-system $i_{sq}$ 14a, as can be seen in FIG. 1. The stator current control box 17 calculates a stator current in x-direction that should be present and compares it with the measured stator current in the x-direction $i_{sx}$ 12a. The discrepancy between the calculated and the fraction of the measured stator current in x-direction is used to create a voltage error term $u_{Comp}$ 18 that is the main output of the stator current control box 17. This error voltage 18 is used as an input for the voltage vector control box 19, where the voltage vector $u_{sy}$ 7 is calculated. This calculated value of the voltage vector 7 is transferred to the electric inverter unit 3 that is used for driving the electric motor 2.

Figure 2:
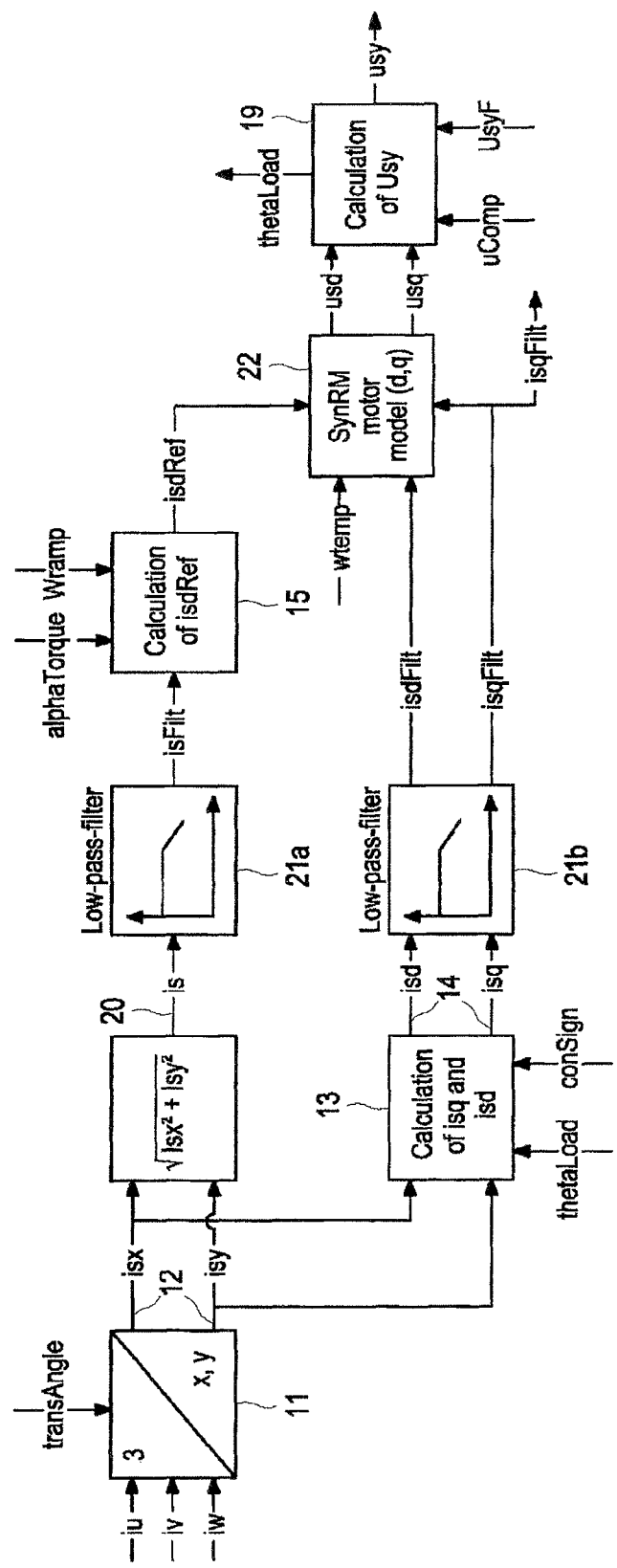
FIG. 2: is a more detailed block diagram of a part of a possible embodiment for the calculation of the voltage vector.

In FIG. 2 a more detailed drawing of the preparation of the various signals is shown. In particular, one has to realise that some more steps in between are preferably performed. In particular, the various measured and calculated currents 12, 14, 20 are first passed through low-pass filters 21a, 21b before they are used for further processing. This is important, because otherwise electric noise that is generated by the inverter unit 3 of the electric motor unit 1 itself could significantly disturb the control loop and hence lead to unwanted fluctuations and an unwanted behaviour of the electric motor 2.

Yet another modification is indicated in FIG. 2. This is the modifying block 22 in which the voltages $u_{sd}$ and $u_{sq}$ are calculated from a steady-state synchronous reluctance machine motor model in the d-q-system. By using this modification block 22 dead times and/or voltage drops for the various semiconductor components are taken into account for the calculation of the voltage vector 7. First experiments have shown that by using this modification block 22 in particular the low speed performance of the electric motor 2 can be improved.

In FIG. 3 the various reference frames and some of the (vectorial) parameters are illustrated. The x-y-system (x-y-reference frame) is spanned by the x-axis 23 and the y-axis 24. The x-y-system represents the coordinate system of the rotating magnetic field that is created by the stator of the electric motor 2.

The d-q-system (d-q-reference frame) is spanned by the d-axis 25 and the q-axis 26. The d-q-system also rotates with the same frequency ω as the x-y-system. However, if a load is applied to the rotating shaft 10 of the electric motor 2, a shift between the x-y-system and the d-q-system will occur. The shift will manifest itself in form of the so-called load angle 27 (the angle between the y-axis 24 and the q-axis 26).

Figure 4:
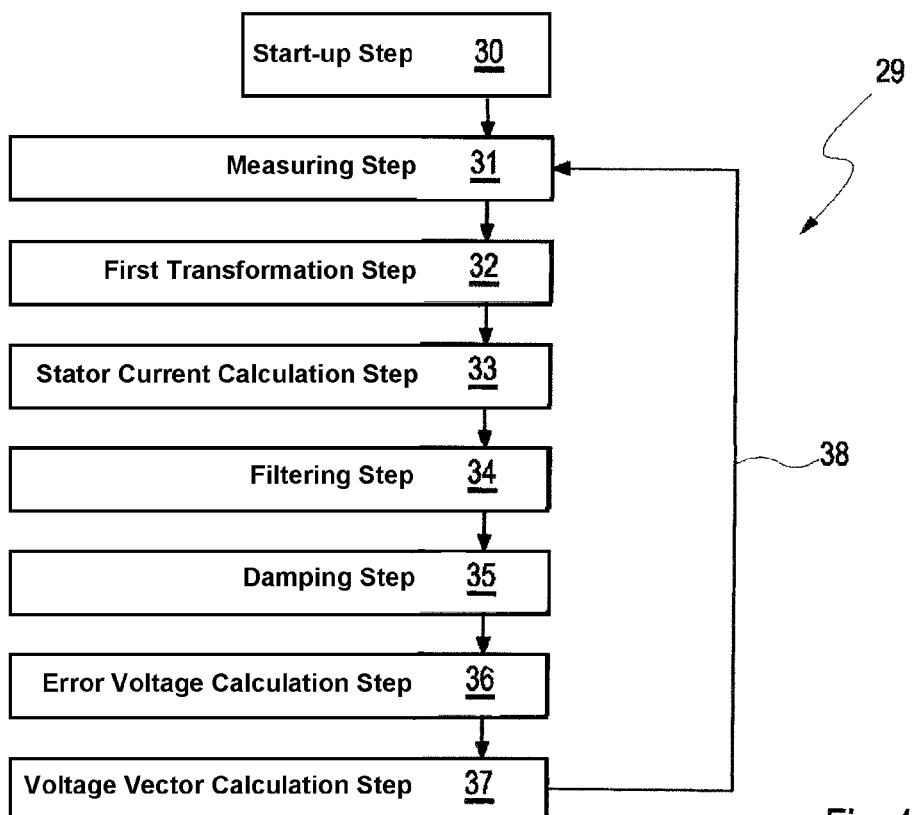
FIG. 4: is a possible embodiment of a method for controlling an electric motor.

In FIG. 4, a schematic overview of a possible embodiment of a method for actuating an electric motor 2 is shown in form of a flowchart 29. First of all, the algorithm starts with a start-up step 30. During the start-up step 30, various parameters can be read in, in particular some design parameters of the electric motor 2 or other components of the electric motor unit 1. This data can be read out of an electronic memory 6, for example.

Then the current electric current is measured in step 31. The measured current (more exactly: the three phases u, v, w of the electric current 4) is transformed into the x-y-system in first transformation step 32. Hence, one obtains the $i_{sx}$ and $i_{sy}$ currents 12.

Then, the stator current reference value in the d-direction isdRef 16 is calculated in the stator current calculation step 33.

After this, a filter function is applied to the various calculated and measured values in filtering step 34.

After this, the damping function is applied in damping step 35.

Hence, the error signal of the driving voltage $u_{Comp}$ 18 is calculated in the error voltage calculation step 36. Based on this, the driving voltage vector 7 is calculated in voltage vector calculation step 37. This refers both to the magnitude of the voltage vector 7, as well as to its direction (voltage vector angle).

After this the loop is closed by a step-back function 38.

Additional information can be taken from U.S. application Ser. No. 14/407,500 with the title "Variable torque angle for electric motor" filed on Dec. 12, 2014 (which application claims priority from GB1210706.6), the entire contents of which are hereby incorporated by reference.

The embodiments of the invention described above are provided by way of example only. The skilled person will be aware of many modifications, changes and substitutions that could be made without departing from the scope of the present invention. The claims of the present invention are intended to cover all such modifications, changes and substitutions as fall within the spirit and scope of the invention.

What is claimed is:

1. A method for controlling a synchronous reluctance electric motor, the method comprising the steps of:
    a controller unit applying at least one voltage vector to an inverter unit for providing an electric current to the synchronous reluctance electric motor;
    the controller unit receiving measurement of the electric current provided to the synchronous reluctance electric motor;
    the controller unit transforming the measured electric current into a rotating x-y-reference frame before transforming the measured electric current into a d-q-reference frame;
    the controller unit determining the component of the measured electric current in the d-direction of the d-q-reference frame; and
    the controller unit controlling the voltage vector applied to the inverter unit based only on the component of the measured electric current in the d-direction of the d-q-reference frame.

2. The method according to claim 1, wherein the controller unit compares the measured electric current to at least one reference value.

3. The method according to claim 1, wherein the controller unit controls the voltage vector at least at times additionally based on at least one sensor signal and/or at least at times based on at least one control command.

4. The method according to claim 1, wherein at least in part and/or at least at times the controller unit uses at least one damping loop.

5. The method according to claim 1, further comprising the steps of:
    the controller unit applying at least one limiting function to the synchronous reluctance electric motor;

wherein the at least one limiting function limits said voltage vector and/or said electric current; and the synchronous reluctance electric motor generates a mechanical force.

6. The method according to claim 1, wherein the controller unit applies at least one correcting function in order to correct for non-linear behavior of at least one electric and/or electronic component.

7. The method according to claim 1, wherein the measurement of the electric current provided to the synchronous reluctance electric motor is measured by at least one electric current measuring device.

8. An electric motor unit, wherein the electric motor unit is designed and arranged to perform the method according to claim 1.

* * * * *